United States Patent
Kamimura et al.

(12)

(10) Patent No.: US 6,262,358 B1
(45) Date of Patent: Jul. 17, 2001

(54) SOLAR CELL MODULE AND SOLAR CELL PANEL USING THE SAME

(75) Inventors: Kunio Kamimura, Kashiba; Keiji Shimada, Kitakatsuragi-gun; Toshinobu Matsutani; Tatsuo Saga, both of Shiki-gun, all of (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/504,101

(22) Filed: Feb. 14, 2000

(30) Foreign Application Priority Data

Feb. 18, 1999 (JP) .................................................. 11-039578

(51) Int. Cl.⁷ ................................................. H01L 31/048
(52) U.S. Cl. .......................... 136/244; 136/246; 136/251; 136/256; 257/433; 257/436
(58) Field of Search ................................... 136/244, 246, 136/251, 256; 257/433, 436

(56) References Cited

U.S. PATENT DOCUMENTS

| 4,210,462 | * | 7/1980 | Tourneux | 136/251 |
| 4,499,658 | * | 2/1985 | Lewis | 136/251 |
| 4,832,755 | * | 5/1989 | Barton et al. | 136/251 |
| 5,478,402 | | 12/1995 | Hanoka | 136/251 |
| 5,616,185 | * | 4/1997 | Kukulka | 136/244 |

FOREIGN PATENT DOCUMENTS

| 261885 | * | 3/1988 | (EP) . |
| 0 474 349 A2 | | 3/1992 | (EP) . |
| 0 535 614 A2 | | 4/1993 | (EP) . |
| 59-5678 | | 1/1984 | (JP) . |
| 61-202474 | | 9/1986 | (JP) . |
| 5-136441 | | 6/1993 | (JP) . |
| 5-190882 | * | 7/1993 | (JP) . |
| 8-250756 | | 9/1996 | (JP) . |
| WO 98/49735 | * | 11/1998 | (WO) . |

OTHER PUBLICATIONS

Patent Abstracts of Japan, vol. 008, No. 209 (E–268), Sep. 22, 1984 for JP 59 094880 A (Fuji Denki Sougou Kenkyusho:KK), May 31, 1984.

Patent Abstracts of Japan vol. 013, No. 058 (E–714), Feb. 9, 1989 for JP 63 248182 A (Mitsubishi Electric Corp), Oct. 14, 1988.

Patent Abstracts of Japan, vol. 17, No. 542 (E–1441), Sep. 29, 1993 for JP 05 152596 A (Sharp Corp), Jun. 18, 1993.

Patent Abstracts of Japan vol. 012, No. 037 (C–473), Feb. 4, 1988 for JP 62 187141 A (Nippon Electric Glass Co Ltd), Aug. 15, 1987.

* cited by examiner

*Primary Examiner*—Alan Diamond
(74) *Attorney, Agent, or Firm*—Nixon & Vanderhye P.C.

(57) ABSTRACT

A solar cell module includes a substrate, a plurality of solar cells arranged in a plane on the substrate, a connection member for electrically connecting the plurality of solar cells to each other to form a power generating circuit, and a single transparent cover sheet for covering the plurality of solar cells and the connection member.

20 Claims, 12 Drawing Sheets

SOLAR CELL MODULE AND SOLAR CELL PANEL USING THE SAME

CROSS-REFERENCE TO RELATED APPLICATION

This application is related to Japanese Patent Application No. HEI 11(1999)-039578 filed on Feb. 18, 1999, whose priority is claimed under 35 USC §119, the disclosure of which is incorporated by reference in its entirety.

BACKGROUND OF THE INVENTION

1. Field of the Invention

The present invention relates to a solar cell module and a solar cell panel using the same, and particularly to a solar cell module including a plurality of cells covered with cover glass sheets and a solar cell panel using the solar cell module.

2. Description of Related Art

Figure 15:
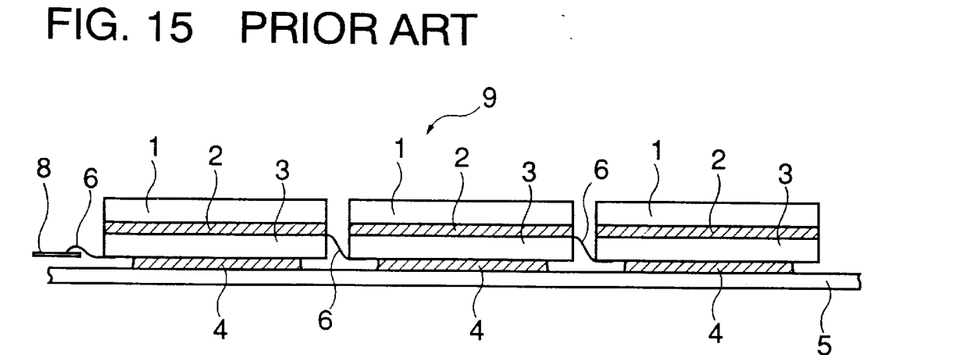
FIG. 15 is a sectional view of a main part of a conventional solar cell module.

Referring to FIG. 15, a conventional solar cell module 9 for use in space is formed by bonding cover glass sheets 1 to a plurality of solar cells 3 with adhesive layers 2, connecting the cells 3 to each other in parallel and in series using interconnectors 6, and bonding the cells to a substrate 5 with adhesive layers 4. The solar cell module 9 includes a bus bar 8 through which the module 9 is electrically connected with another solar cell module. Consequently, the interconnectors 6 and the bus bar 8 mounted at an end of the module 9 are exposed to the environment in space (see Japanese Unexamined Patent Publication No. HEI 5(1993)-136441, for example).

The space environment is also an electromagnetic environment, where ionized electrons and ions exist in a plasmatic state. Therefore, the solar cell module 9, whose interconnectors 6 are exposed in such an environment, may electrically discharge via the interconnectors 6, which results in a decrease in generated electric power and destruction of the solar cells 3. For this reason, the interconnectors 6 themselves are covered with an insulating resin (see Japanese Unexamined Patent Publication No. HEI 61(1986)-202474, for example).

Figure 16:
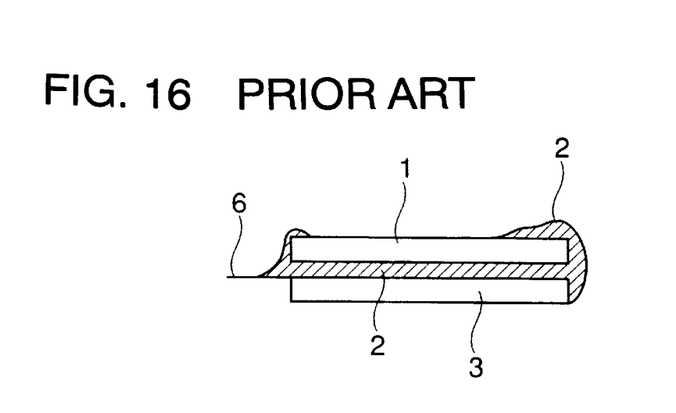
FIG. 16 is an enlarged sectional view of a main part of the conventional solar cell module.

Also, in the conventional module, the adhesive layer 2 is forced out of the sides onto the top surface of the cover glass sheets 1 when the solar cells are bonded to the cover glass sheets 1, as shown in FIG. 16. If the forced out adhesive layer 2 is exposed to the space environment, it reduces its light transmittance and consequently decreases the output of the solar cells 3 thereunder. Therefore, the forced out adhesive layer needs to be removed. The removal thereof causes failures in production since the solar cells 3 and the cover glass sheets 1 are usually as thin as 50 μm to 200 μm and apt to break easily.

Further, in the conventional module, to bond each cover glass sheet 1 to each solar cell 3 takes a lot of time and labor. Besides, portions of the solar cells 3 which are not covered with the cover glass sheets 1 are deteriorated rapidly in the space environment, especially even due to low-energy protonic radiation. On the other hand, if the cover glass sheets 1 are larger than the solar cells 3, the ratio of the area of the solar cells 3 to the total area of the module decreases and accordingly the output of the solar cell module per unit area declines.

For this reason, it is not preferable to use larger cover glass sheets than the solar cells 3. Accordingly, at the boding of the glass sheets 1 to the solar cells 3, high accuracy in size is required so that each solar cells 3 is not projected from each cover glass sheet 1. This makes the bonding operation more time- and labor-consuming.

Furthermore, inexact positioning between the solar cells 3 and the cover glass sheets 1 results in an increased distance between adjacent solar cells and a consequent decline in power-generating efficiency per area.

SUMMARY OF THE INVENTION

The present invention provides a solar cell module including a substrate; a plurality of solar cells arranged in a plane on the substrate; a connection member for electrically connecting the plurality of solar cells to each other to form a power generating circuit; and a single transparent cover sheet for covering the plurality of solar cells and the connection member.

According to the present invention, because the single transparent cover sheet serves to cover the plurality of solar cells, accurate positioning of the solar cells is not required except in the periphery of the module, and there is little possibility of the adhesive layer being forced out onto the transparent cover sheet. Also because the electric connection member between the solar cells is covered with the transparent cover sheet, the connection member is less affected adversely by the electromagnetic environment in space.

These and other objects of the present application will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

The substrate in the present invention preferably has flexibility to some extent in view of the possibility that the solar cell module may be mounted on a panel having a curvature. For this purpose, a film of a polyimide resin having a thickness of 0.1 to 0.2 mm or an FRP film may be used as the substrate. As solar cells, usable are conventionally known cells such as what are called silicon solar cells which are constructed, for example, by diffusing P-type impurities in a surface area of N-type silicon wafer. Such solar cells have, for example, a thickness of 50 $\mu$m to 200 $\mu$m and a size of 65 mm×105 mm. The size of the solar cell is generally determined by a wafer size to be used.

The connection member for electrically connecting the solar cells to each other means a member generally referred to as an interconnector in the field of art which serves for connection between solar cells and a member generally referred to as a bus bar in the field of art which serves to take output current from a solar cell module. The interconnector preferably has a structure for absorbing an external stress, i.e., what is called stress relief structure. As materials for the bas bar, silver, gold-plated silver, silver-plated Koval (trademark for an iron-nickel-cobalt alloy), molybdenum, aluminum, copper and the like may be mentioned. The single transparent cover sheet may have a thickens of 50 $\mu$m to 200 $\mu$m and a size of 150 mm×200 mm to 300 mm×400 mm to covering 5–20 solar cells.

The transparent cover sheet, which is usually referred to as a cover glass sheet, is preferably made of a material which does not color when exposed to radiation from space, efficiently transmits light having wavelengths suiting the wavelength sensitivity of the solar cells (for example, light with wavelengths of 0.35 $\mu$m to 1.2 $\mu$m) can provide good protection for the solar cells against radiation from space and has a good mechanical strength and thermal resistance. For example, an inorganic glass sheet having a thickness of about 50 $\mu$m to 200 $\mu$m may be used. Especially a cerium-containing glass is preferred since it is not apt to color when exposed to cosmic rays and the like.

In the solar cell module of the present invention, a plurality of solar cells are connected in series and/or in parallel by the connection member to form a power generating circuit. Where a number of solar cell modules are combined to form a solar cell panel, a protecting element such as a diode or switching device is preferably connected to each power generating circuit in parallel so that, if any certain module or certain cell cannot receive solar light for an external cause, electric current may bypass the power generating circuit through the protecting element.

The protecting element may be connected to each solar cell in parallel. However, since such arrangement requires a large number of protecting elements, it is preferable that one protecting element is connected to each module, i.e., each power generating circuit.

Where a plurality of solar cell modules according to the present invention are combined to form a solar cell panel, the output of which is usually connected to a load and a battery, it is preferable to connect a protecting element such as an inverse voltage stop diode, i.e., a blocking diode, in series to each solar cell module for blocking inverse voltage from the battery when the solar cell modules cannot receive solar light.

The above-mentioned protecting elements such as bypass diodes or blocking diodes are placed between the substrate and the transparent cover sheet. In this case, at least one of the solar cells may be provided with a notch for accommodating the bypass diode or blocking diode in a space defined by the notch.

Where there exist spaces between adjacent cells, such a diode may be put in the space. In such case, the bypass diode and blocking diode preferably have a shape (e.g., have a triangular or trapezoidal cross section) corresponding to the spaces in which they are accommodated.

The solar cell module of the present invention may further be provided with a connecting terminal for connecting the output of the electric circuit to outside. For ensuring a space for accommodating the connecting terminal, the solar cells may be provided with a notch.

Where the connecting terminals as described above are used for connection between solar cell modules, the transparent cover sheets of the modules may be provided with notches beforehand in correspondence to the connecting terminals. After the solar cell modules are connected to each other, the notches of the transparent cover sheets are covered with glass or ceramics in order that the connecting terminals are sheltered from radiation and from an electric-field environment in the space.

In one solar cell module, a plurality of independent power generating circuit may be formed. In such a case, the bypass diode is preferably connected in parallel to each power generating circuit.

A plurality of solar cell modules may be combined to form an electric power generating circuit.

Preferably, the solar cells are bonded to the transparent cover sheet with a resin layer and the resin layer is made of a silicone resin which emits little gas. In this case, since the silicone resin drastically changes its properties at a low temperature (about –100° C.), an isolation member is preferably provided for dividing the resin layer in order to decrease stress generated when the properties change.

The transparent cover sheet may be provided with projections for positioning the solar cells.

In order to absorb the distortion caused by the difference in thermal expansion coefficient between the solar cells and the transparent cover sheet, a member having a higher thermal expansion coefficient than the solar cells are preferably placed between adjacent solar cells.

Preferably, these members are less stiff than the solar cells so as to ease mechanical stress.

A member extending between adjacent solar cells whose tip abuts the transparent cover sheet may be mounted on the substrate. The tip may be adapted to reflect solar light and make it incident onto the solar cells.

The transparent cover sheet may be composed of a plurality of small glass sheets each having the same size as the solar cell which are flatly patched to be changed into a single transparent cover sheet using a bonding material having a lower thermal expansion coefficient than the small glass sheets.

Preferably, the transparent cover sheet is formed beforehand to include a cut or slit which allow the transparent cover sheet to break between adjacent solar cells when the cover sheet receives mechanical or thermal stress.

In another aspect, the present invention also provides a solar cell module including a plurality of solar cells electrically connected to each other and arranged planarly; and a single transparent cover sheet for covering the plurality of solar cells, wherein the plurality of solar cells are bonded to the transparent cover sheet.

According to this arrangement, because the solar cells with an electric connection member (an interconnector) for connecting the solar cells to each other are also covered with the transparent cover sheet, the solar cells and connection member are less affected by the electromagnetic environment in the space.

In this case, a plurality of solar cell modules can be placed in a plane on one substrate for use. Accordingly, workability in handling and installing the solar cells improves.

EXAMPLES

The invention is now detailed further with reference to the accompanying figures.

Figure 1:
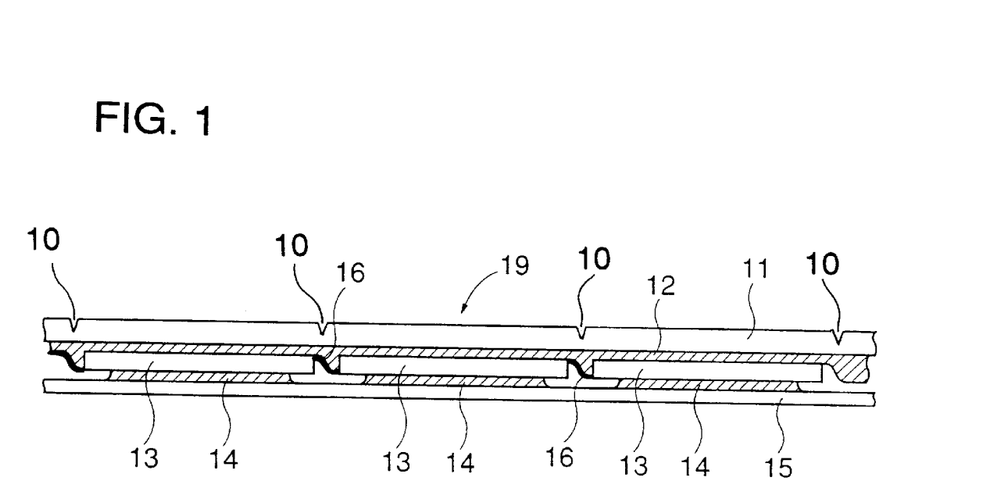
FIG. 1 is a sectional view of a main part of a solar cell module in accordance with one embodiment of the present invention.

FIG. 1 is a sectional view of a main part of a solar cell module 19 in accordance with one embodiment of the present invention. As shown in the figure, the solar cell module 19 is provided with a substrate 15, a plurality of solar cells 13 arranged in a plane on the substrate 15 and bonded thereto with adhesive layers 14, connecting members, i.e., interconnectors 16, for electrically connecting the plurality of solar cells 13 to each other, and a single cover glass sheet 11 covering the solar cells 13 and the interconnectors 16. The cover glass sheet 11 is bonded to the solar cells 13 and interconnectors 16 with an adhesive layer 12.

The solar cell module 19 is constructed such that the plurality of solar cells 13 are covered with the single cover glass sheet 11. Thus, to place the solar cells 13 within the cover glass sheet 11, high accuracy of positioning the solar cells 13 is not required.

The adhesive layer 12 is not pushed out onto the upper face of the cover glass sheet 11 except the periphery.

Though not shown, if the interconnectors 16 are constructed to have a stress relief portion, stress is absorbed even if distortion is generated by a thermal environment in the space, so that detachment of the adhesive layer 12 and damage to the solar cells 13 and the cover glass sheet 11 can be reduced.

Preferably, as shown in FIG. 1 the cover glass sheet 11 is formed beforehand to have slit-like cuts 10 along boundary lines between the solar sells 13 on a surface thereof so that the slit-like cuts 10 allow the cover glass 11 to break between the adjacent solar cells 13 when the cover glass sheet 11 is subjected to an excessive stress. With this construction, more significant damage to the solar cells 13 can be avoided.

Figure 2:
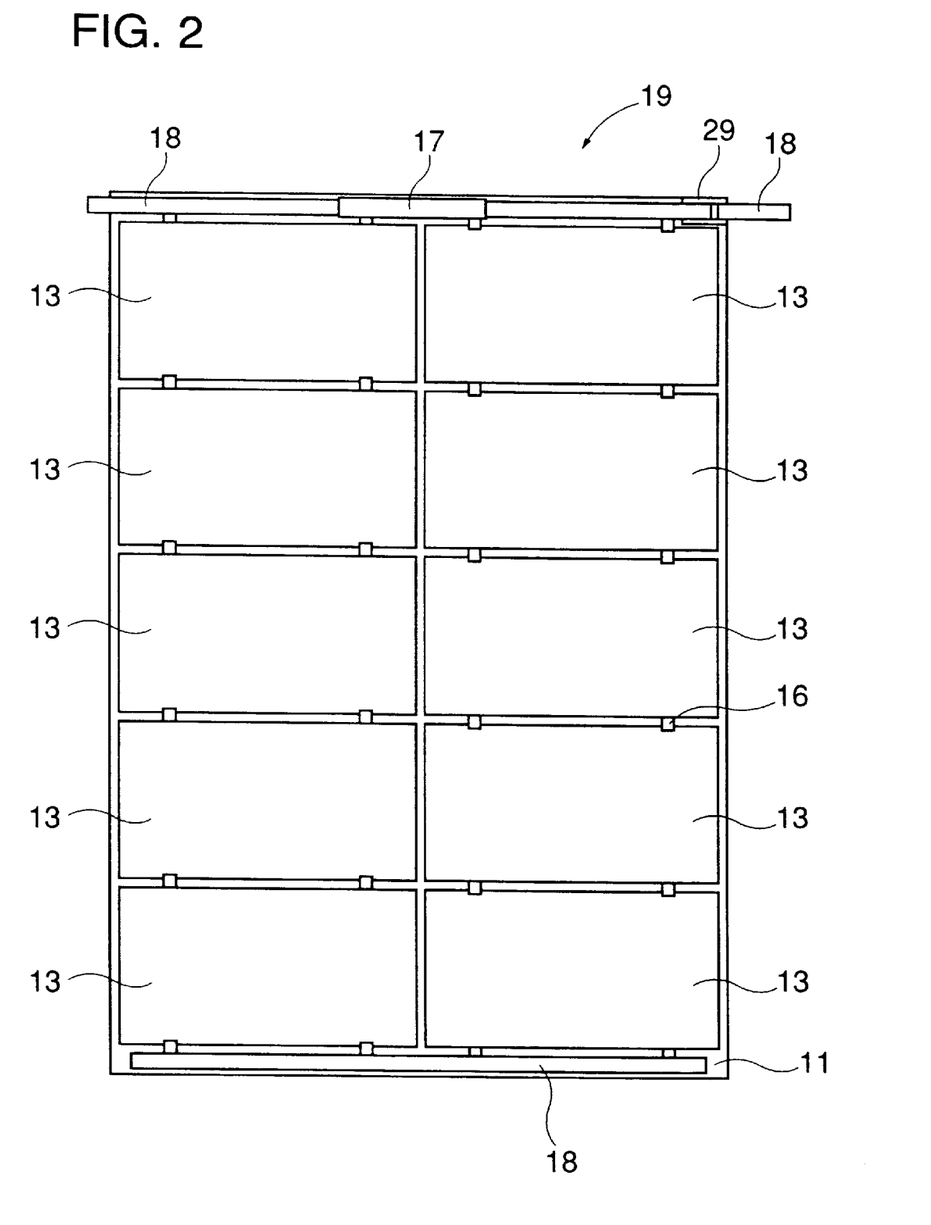
FIG. 2 is a plan view of the solar cell module shown in FIG. 1.
Figure 3:
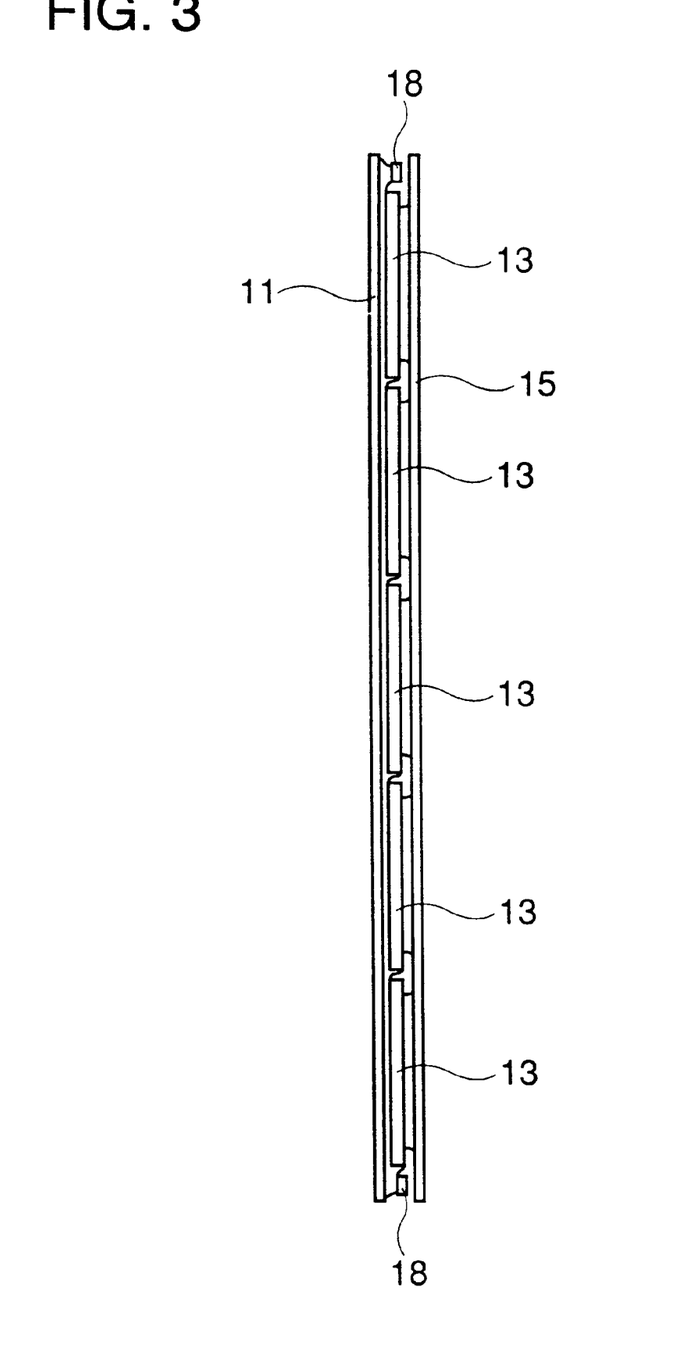
FIG. 3 is a side view of the solar cell module shown in FIG. 2.

FIG. 2 is a plan view of the solar cell module 19 of this embodiment and FIG. 3 is a side view thereof. It is noted that FIG. 2 shows a state of the module 19 in which the substrate 15 is taken off for simplicity of drawing. In these figures, five solar cells 13 are bonded in each of the right and left columns to the cover glass sheet 11. Further, a bypass diode 17, a blocking diode 29 and bus bars 18 also are bonded to the cover glass sheet 11.

Figure 4:
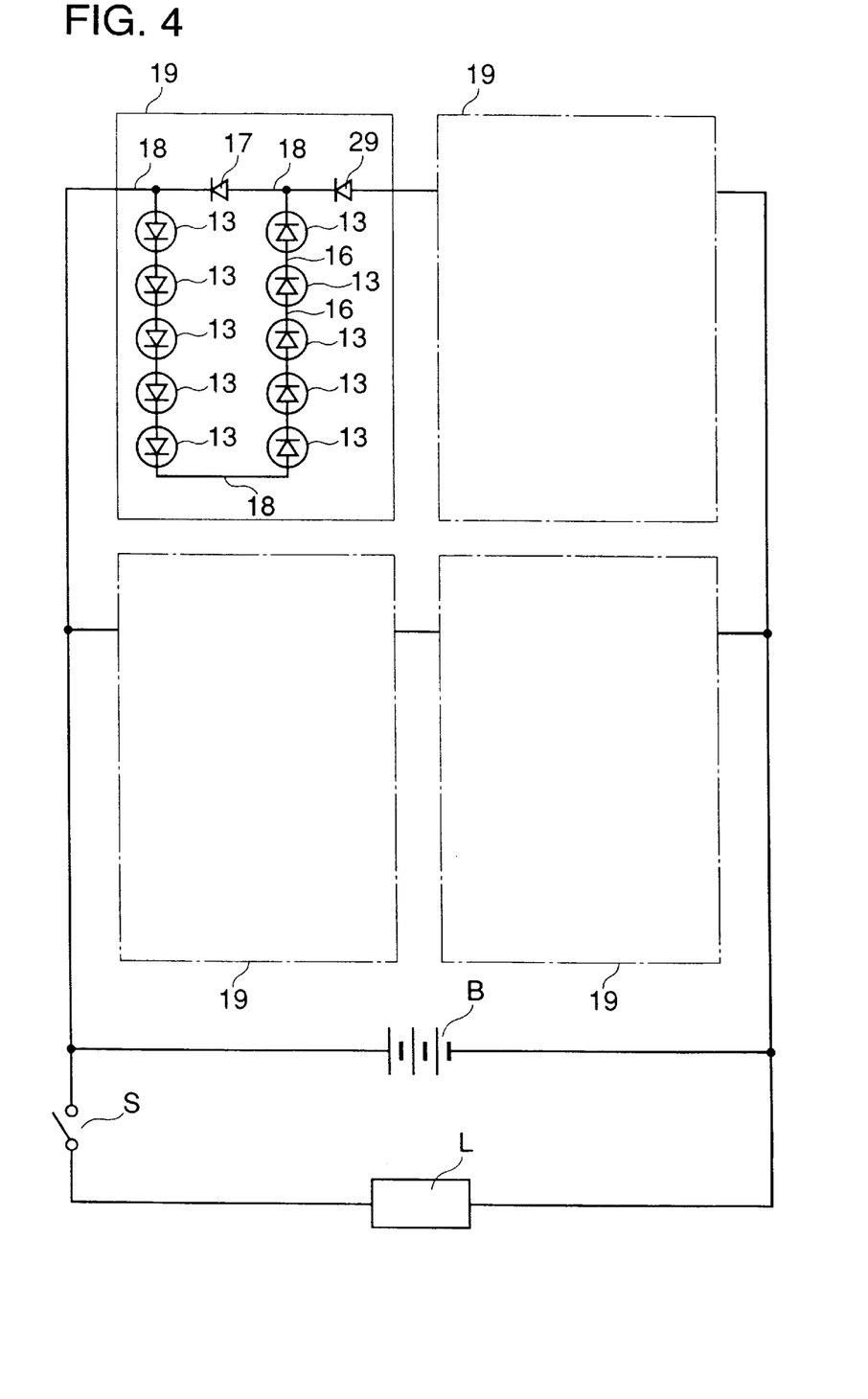
FIG. 4 is an electric circuit diagram illustrating a circuit of the solar cell module shown in FIG. 2 and showing a way the solar cell module is used.

Thus, all necessary electric circuit components of the module, i.e., the solar cells 13, interconnectors 16, bus bars 18, bypass diode 17 and blocking diode 29 are covered with the cover glass sheet 11 and can be protected from the space environment. FIG. 4 is an electric circuit diagram illustrating an example of a circuit in this module.

FIG. 4 shows an electric circuit of a solar cell panel including four solar cell modules 19. In each solar cell module 19, two sets of series circuits each having five solar cells 13 connected in series by interconnectors 16 are further connected in series by another bus bar 18 to form a single power generating circuit. One end of the power generating circuit is taken out by a bus bar 18 and another end thereof is taken out via a blocking diode 29. This power generating circuit is connected to a bypass diode 17 in parallel.

The four solar cell modules 19 are connected to each other in series and parallel to supply power to a load L via a switch S. A supplementary battery B is inserted across the load L.

When the four solar cell modules 19 are irradiated with light, they supply power to the load L and charge the battery B. If one of the four solar cell modules 19 is not irradiated with light, current from the other solar cell modules 19 is supplied to the load L and battery B via the bypass diode 17 of the non-irradiated solar cell module 19. If the voltage generated by one of the solar cell modules 19 declines and inverse voltage is applied from the battery B to the solar module 19, the blocking diode 29 acts to stop the inverse voltage to protect the solar cell module 19.

Figure 5:
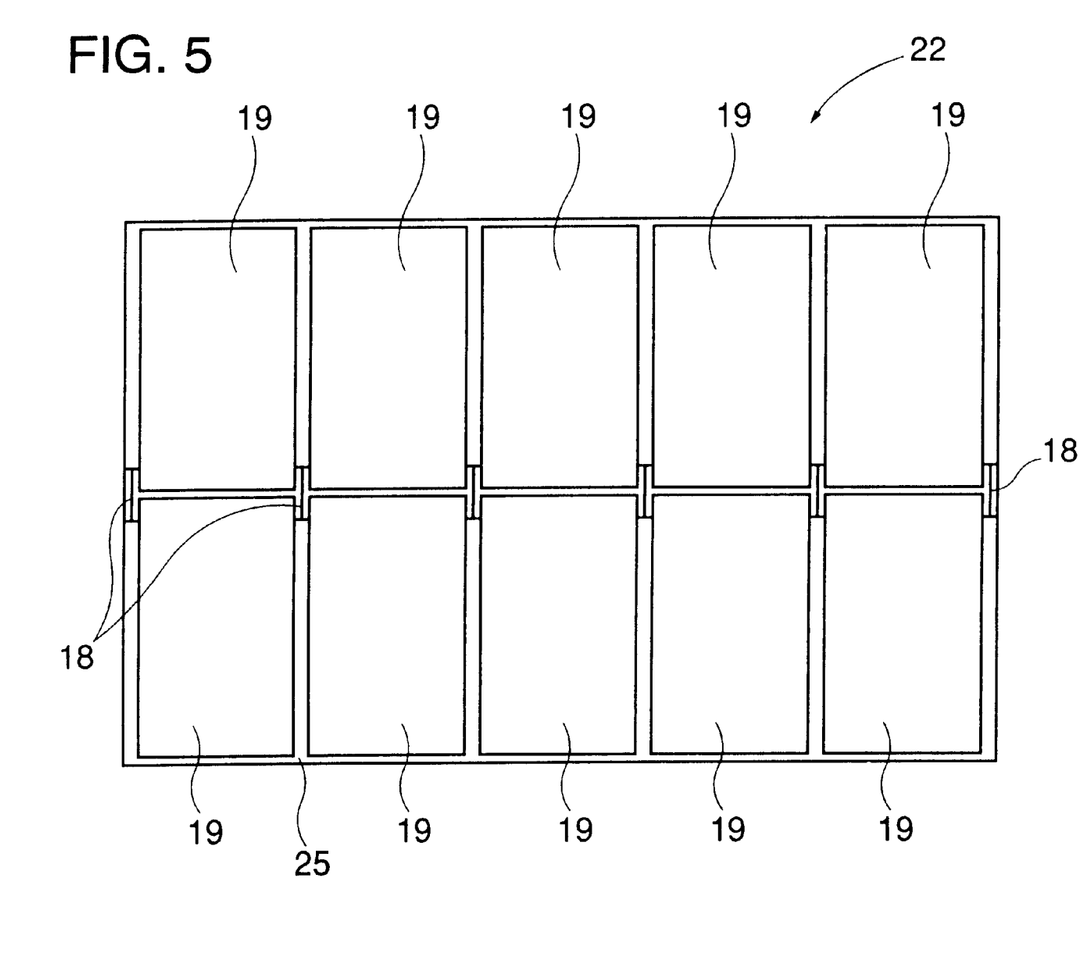
FIG. 5 is a plan view of an example of a panel in which solar cell modules as shown in FIG. 2 are incorporated.

Next, FIG. 5 is a plan view of a solar cell panel 22 in which ten solar cell modules 19 are electrically connected in series or in parallel and mounted on a base plate 25.

Figure 6:
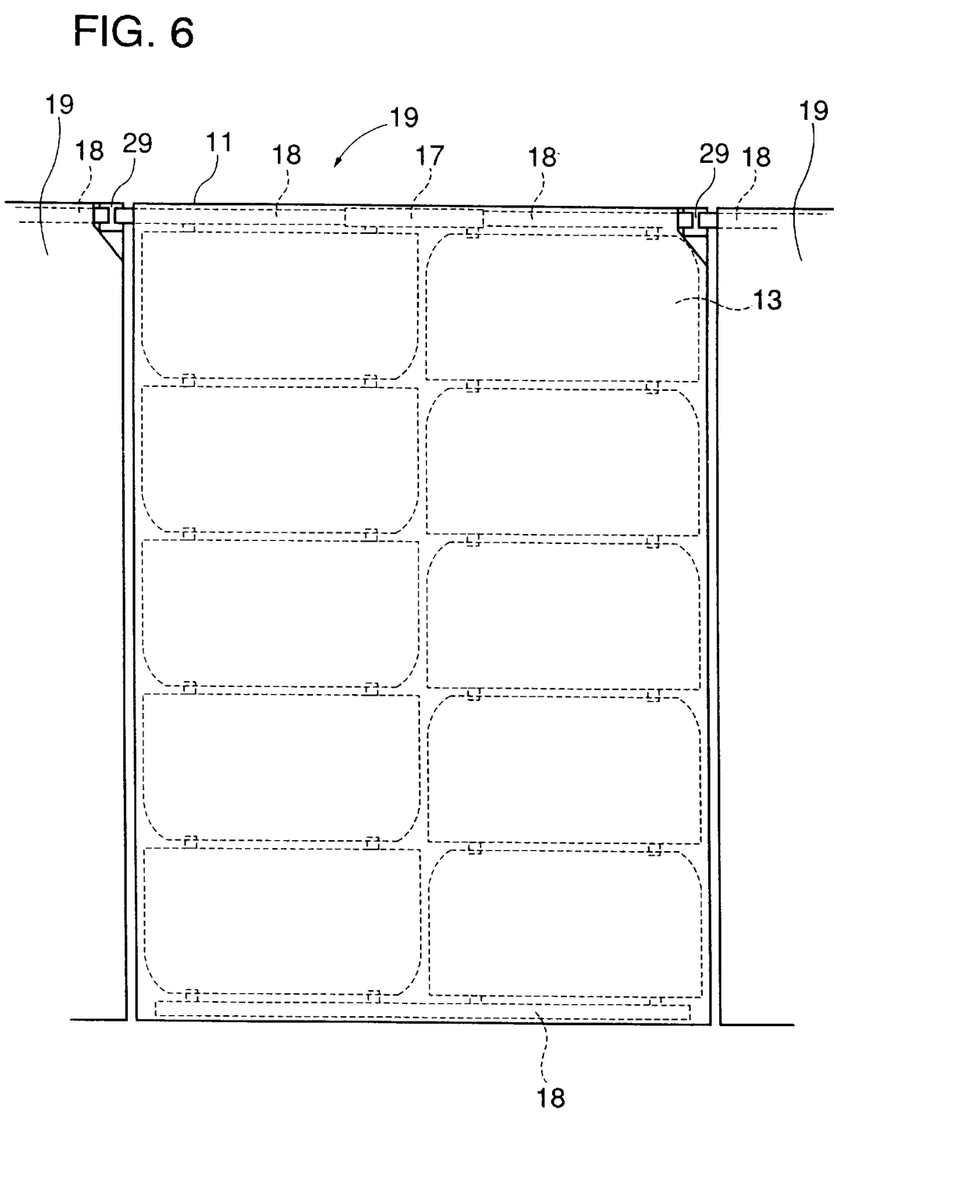
FIG. 6 is a plan view of a solar cell module in accordance with another embodiment of the present invention.

FIG. 6 illustrates another embodiment of the present invention, in which solar cells 13 are shaped to have notches in their both shoulders. Spaces defined by the notches are used for connection between adjacent solar cell modules 19. Cover glass sheet 11 also has a cut portion corresponding to the connection portion. Small cover glass sheet, not shown, is bonded there to cover the cut portion after the modules have been connected. The connection of the modules 19 is performed by soldering or welding.

Figure 7:
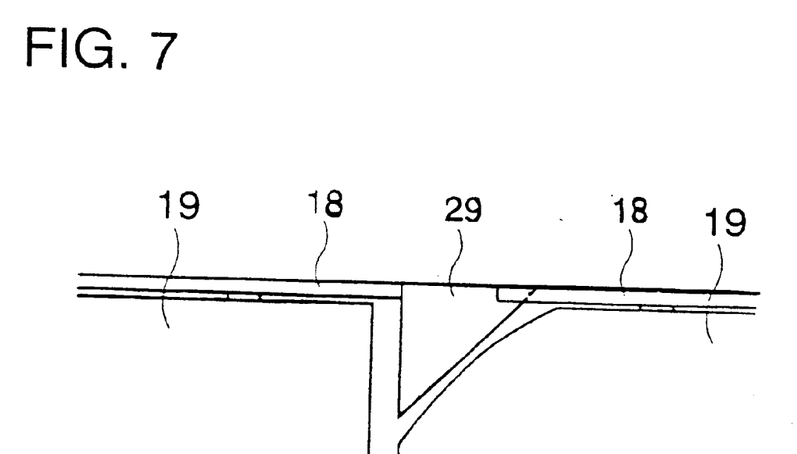
FIG. 7 is an enlarged view of a main part illustrating a modification of the solar cell module of the present invention.
Figure 8:
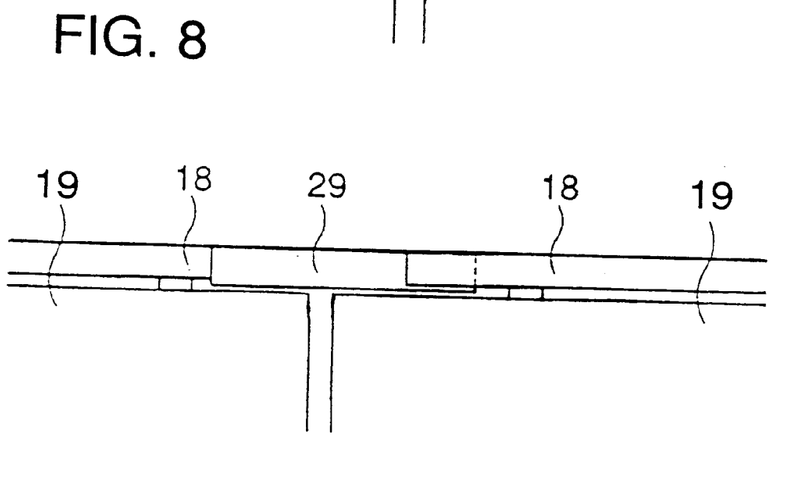
FIG. 8 is an enlarged view of a main part illustrating another modification of the solar cell module of the present invention.

FIGS. 7 and 8 are enlarged views of main parts of modified examples of the solar cell modules 19. FIGS. 7 and 8 show the blocking diodes 29 of different shapes, illustrating how two adjacent solar cell modules 19 are connected to each other through the blocking diode 29. FIG. 7 shows a case where the blocking diode 29 has a triangular-shape and FIG. 8 shows a case where the blocking diode 29 has a rectangular-shape with substantially the same width as a bus bar 18.

Figure 9:
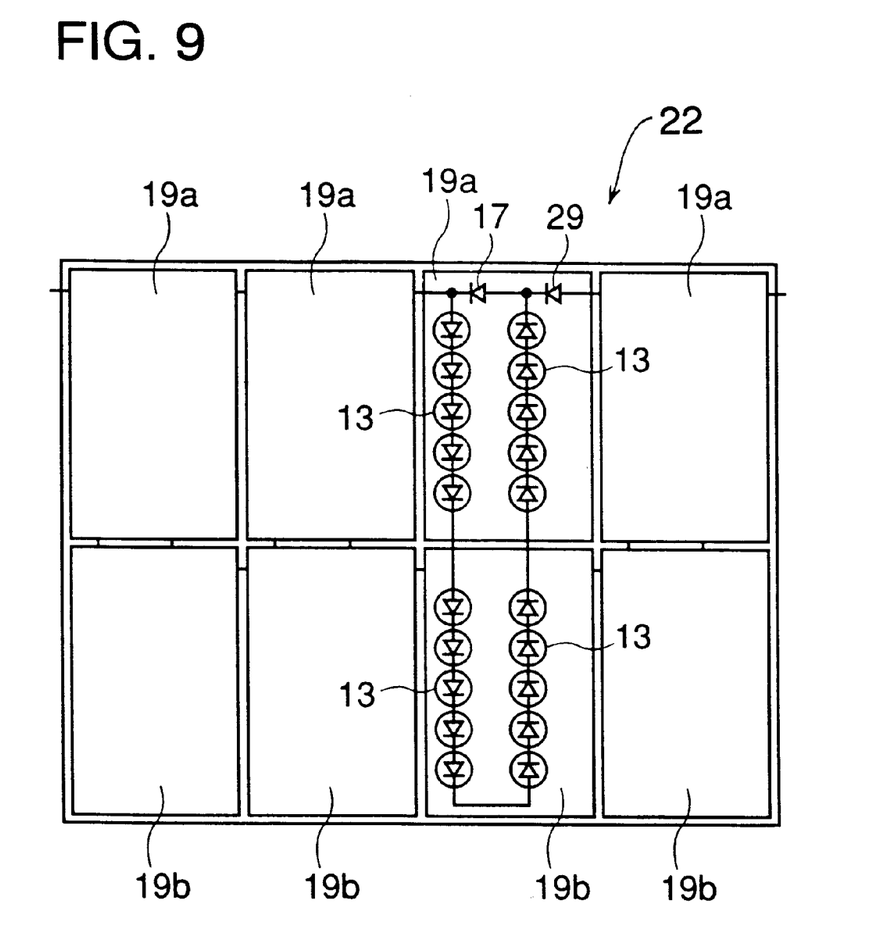
FIG. 9 is a plan view of a solar cell module in accordance with another embodiment of the present invention.

FIG. 9 is a plan view illustrating another embodiment of the present invention. In the figure, a solar cell panel 22 is composed of a combination of four solar cell modules 19a and four solar cell module 19b. The solar cell module 19a is provided with two sets of series circuits of five solar cells 13, a bypass diode 17 and a blocking diode 29. The solar cell module 19b is provided only with a set of a series circuit of ten solar cells 13.

By connecting the solar cell modules 19a and 19b as shown in FIG. 9, obtained is an electric circuit like the circuit of FIG. 4. This arrangement is effective in the case where the solar cell module is too long to be covered with a single cover glass sheet and provide good working and handling properties. All components of each of the solar cell modules 19a and 19b are covered with a cover glass sheet 11 as shown in FIG. 1.

Figure 10:
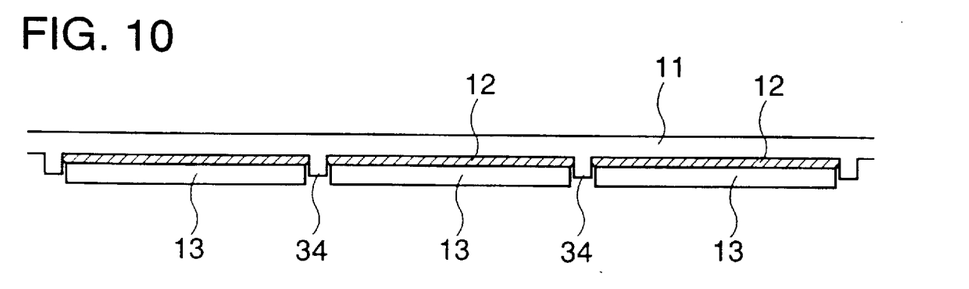
FIG. 10 is a sectional view of a main part of a solar cell module in accordance with another embodiment of the present invention.

FIGS. 10 to 14 are sectional views of main parts illustrating modifications at the bonding portions of the solar cells 3. FIG. 10 shows an example in which the cover glass sheet 11 is provided with projections 34 for easy positioning and bonding of a plurality of solar cells 13. When the surface of the cover glass sheet 11 is shaped, the projections 34 are formed, for example, by a mechanical process or by an etching process with alkali or the like, or by attaching members of glass or ceramics to the surface.

Figure 11:
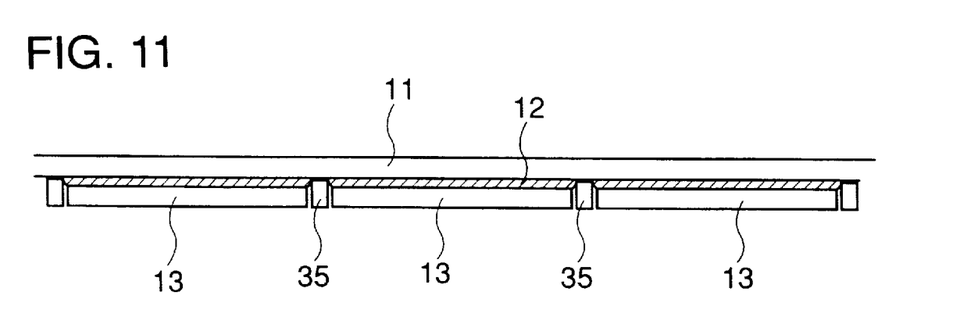
FIG. 11 is a sectional view of a main part of a solar cell module in accordance with another embodiment of the present invention.

When in thermal expansion coefficient the cover glass sheet 11 is larger than the materials of the solar cells 13 and the substrate 15 (FIG. 1), a thermal distortion may be generated by the thermal environment in space, which results in detachment of the adhesive layer 12 and damage to the solar cells 13 and the cover glass sheet 11. To prevent this, provided between the solar cells 13 are members 35 having a higher thermal expansion coefficient and a lower stiffness than the solar cells 13, as shown in FIG. 11. This construction can absorb the thermal distortion.

When a silicone adhesive is used for the adhesive layer 12, the silicon adhesive layer may break the solar cells 13 or the cover glass sheet 11 because the silicon adhesive radically changes its physical properties as it is cooled to a low temperature, e.g., −100° C. That is, its thermal expansion coefficient, elasticity modulus and the like change by several digits. Especially, a larger cover glass sheet 11 and an adhesive layer applied in a larger area will be more affected by changes in temperature.

Figure 12:
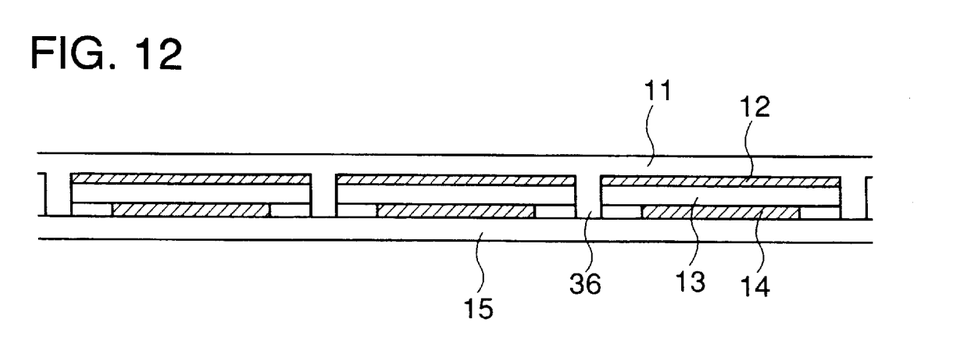
FIG. 12 is a sectional view of a main part of a solar cell module in accordance with another embodiment of the present invention.

For this reason, as shown in FIG. 12, separating members 36 are provided between solar cells for separating the adhesive layer 12 so as to prevent the adhesive layer 12 from forming a single continuous layer.

The above-mentioned members 35 and 36 may be made of a material such as a silicon resin, an epoxy resin, an acrylic resin or the like.

The cover glass sheet 11 may be formed by flatly patching a plurality of small glass sheets using a adhesive having a smaller thermal expansion coefficient than the small glass sheets. With this construction, the mechanical and thermal stress on the cover glass sheet 11 may be reduced and consequently the cover glass sheet 11 is less liable to break.

Figure 13:
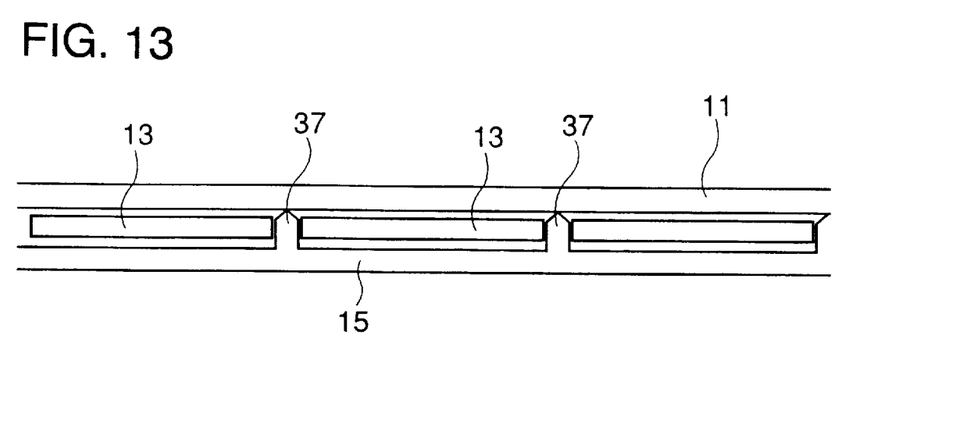
FIG. 13 is a sectional view of a main part of a solar cell module in accordance with another embodiment of the present invention.
Figure 14:
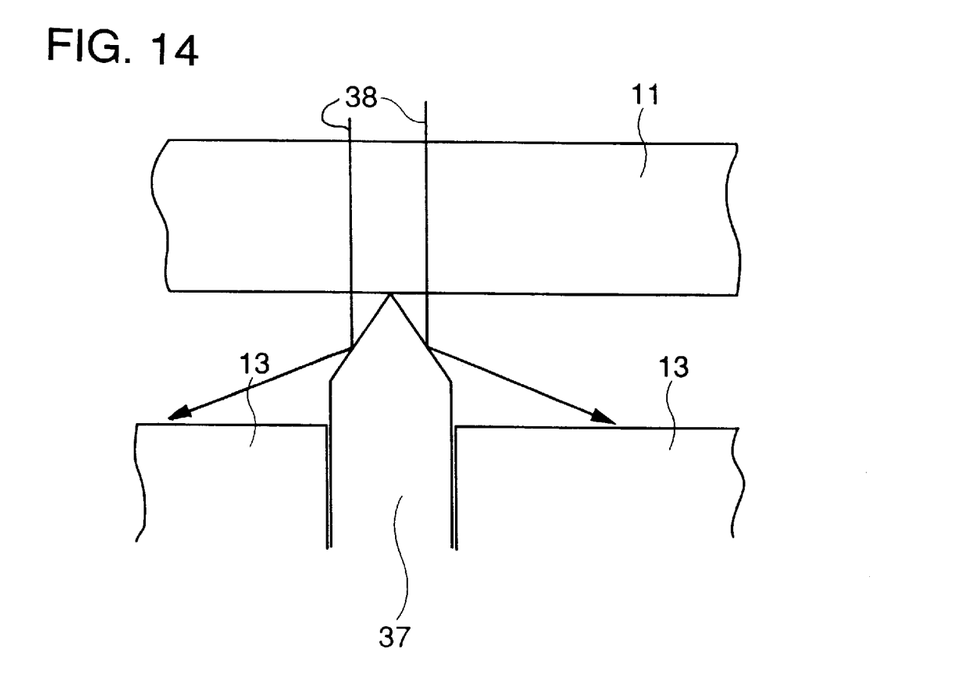
FIG. 14 is an enlarged view of a main part of the solar cell module shown in FIG. 13.

FIG. 13 shows an example in which members 37 are mounted on a substrate 15 for positioning the solar cells 13 or for separating the adhesive layer. As the members 37, may be used those having a sharp tip and high reflecting properties so as to reflect solar light 38 and render it incident on the solar cells 13, as shown in FIG. 14. This reflection by the members 37 increases the amount of solar light incident on the surface of the solar cells 13. Thus the power generated by the solar cell module increases. The tips of the members 37 may be coated with aluminum or silver by deposition for improvement of their reflectance.

Figure 17:
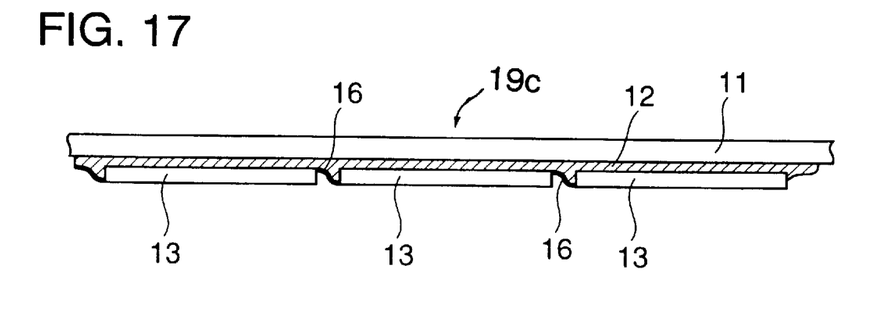
FIG. 17 is a side view of a solar cell module in accordance with another embodiment of the present invention.

FIG. 17 is a side view illustrating still another embodiment of the present invention.

As shown in the figure, in a solar cell module 19c, a plurality of solar cells 13 are arranged in a plane and electrically connected to each other using interconnectors 16. Then the solar cells 13 and the interconnectors 16 are covered with a single cover glass sheet 11. The solar cells 13 and the interconnectors 16 are fixed on a lower surface of the cover glass sheet 11 with an adhesive layer 12 such as a silicone adhesive layer. In other words, the solar cell module 19c of this embodiment is formed by excluding the substrate 15 from the solar cell module 19 shown in FIG. 1.

The cover glass sheet 11 shown in FIG. 17 may also include the projections 34 as shown FIG. 10 for positioning the solar cells 13.

Figure 18:
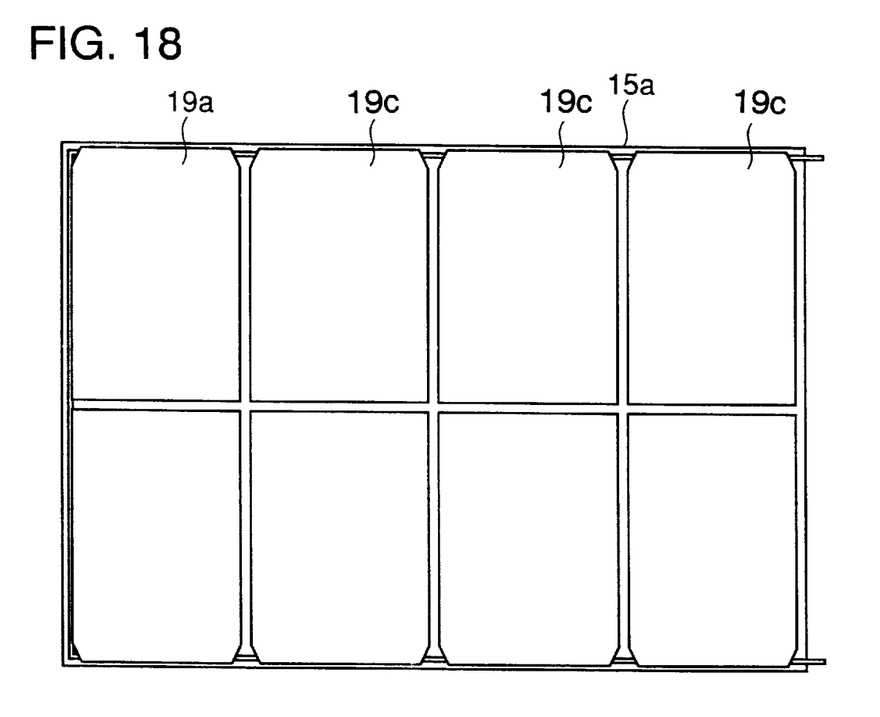
FIG. 18 is a plan view illustrating a way solar cell modules as shown in FIG. 17 are arranged.
Figure 19:
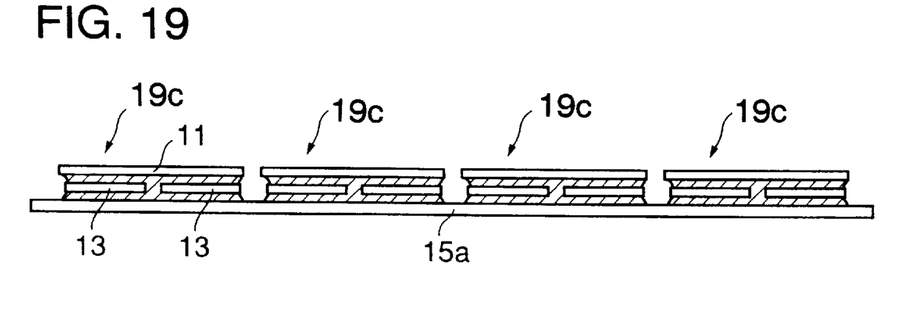
FIG. 19 is a side view illustrating the way solar cell modules as shown in FIG. 17 are arranged.

FIGS. 18 and 19 are a plan view and a side view illustrating a solar cell panel constructed by use of eight of the solar cell modules 19c. Here, the eight solar cell modules 19c are arranged in a plane on a single substrate 15a and electrically connected to each other in series and parallel to compose a single power generating circuit. Also in this embodiment, since the solar cells 13 and the interconnectors 16 are covered with the cover glass sheet 11 as shown in FIG. 17, effect by the electromagnetic environment in space is reduced. Further, since the solar cell modules 19c can be set on the single substrate 15a, the solar cell modules 19c can be easily handled or installed.

According to the present invention, since a plurality of solar cells are bonded to a single cover glass sheet, strict positioning of the cover glass sheet and the solar cells is not necessary any more. Also, an adhesive layer does not leak out onto the upper surface of the cover glass sheet, and therefore, the assembly of the solar cells is greatly simplified. In the case where the cover glass sheet and solar cells need to be positioned accurately, the cover glass sheet may be provided beforehand with projections for positioning the solar cells for simplifying the positioning operation.

Further, since the electrical connection members between the solar cells are also covered with the cover glass sheet, the electrical connection members less interacts with the electromagnetic environment in space.

Furthermore, the setting between the solar cells of the members which are less stiff and have a higher thermal expansion coefficient than the solar cells reduces thermal distortion caused by the thermal environment in space. As a result, the detachment of the adhesive and damage to the solar cells and cover glass sheet are reduced.

What is claimed is:

1. A solar cell module comprising:
    a substrate;
    a plurality of solar cells arranged in a plane on the substrate;
    a connection member for electrically connecting the plurality of solar cells to each other to form a power generating circuit;
    a single transparent cover sheet for covering the plurality of solar cells and the connection member;
    a protective electronic element added to the power generating circuit and provided between the substrate and the transparent cover sheet; and
    wherein at least one of the solar cells has a rectangular or square shape with at least one corner notch, and the protective electronic element is in the corner notch.

2. A solar cell module according to claim 1, wherein the single transparent cover sheet has a size of 150 mm×200 mm to 300 mm×400 mm to cover 5 to 20 solar cells.

3. A solar cell module according to claim 1, wherein the transparent cover sheet is made of a cerium-containing glass and is 50 μm to 200 μm in thickness.

4. A solar cell module according to claim 1, wherein the solar cells are 50 μm to 200 μm in thickness.

5. A solar cell module according to claim 1, wherein the solar cells are bonded to the transparent cover sheet.

6. A solar cell module according to claim 1, wherein the transparent cover sheet has projections for positioning the solar cells, the projections extending toward the solar cells.

7. A solar cell module according to claim 1, further comprising a dividing member, wherein the solar cells are bonded to the transparent cover sheet via an adhesive layer and the dividing member intervenes between adjacent solar cells to divide the adhesive layer for every solar cell.

8. A solar cell module according to claim 1, further comprising a reflection member which extends from the substrate and passes between solar cells and whose tip abuts the transparent cover sheet, the tip of the reflection member being so formed to reflect light incident from the transparent cover sheet toward the solar cells.

9. A solar cell module according to claim 1, further comprising a member for absorbing thermal expansion between the solar cells.

10. A solar cell module according to claim 9, wherein the member for absorbing thermal expansion is lower than the solar cells in rigidness.

11. A solar cell module according to claim 1, wherein the transparent cover sheet has a slit so that the transparent cover sheet is broken at the slit by mechanical or thermal stress.

12. A solar cell module according to claim 1, wherein the protective electronic element is a bypass diode or a blocking diode.

13. A solar cell module according to claim 1, wherein the protective electronic element has a shape corresponding to the shape of the notch.

14. A solar cell module according to claim 1, further comprising a connecting section for electrically connecting the power generating circuit to an external circuit, wherein at least one of the solar cells has a notch and the connecting section is placed in the notch.

15. The solar cell module of claim 1, wherein said cover sheet includes at least one slit or cut provided therein so as to enable the cover sheet to break between solar cells when subjected to excessive stress.

16. A solar cell panel comprising a plurality of solar cell modules as set forth in claim 1.

17. A solar cell panel comprising a plurality of solar cell modules as set forth in claim 1 and a base plate for mounting the plurality of solar cell modules.

18. A solar cell module comprising:

a plurality of solar cells electrically connected to each other and arranged in a plane;

a single transparent cover sheet for covering the plurality of solar cells, wherein the plurality of solar cells are bonded to the transparent cover sheet;

a protective electronic element added to the power generating circuit and provided under the transparent cover sheet; and wherein at least one of the solar cells has a rectangular or square shape with at least one corner notch and the protective electronic element is at least partially in the corner notch.

19. The solar cell module of claim 18, wherein said cover sheet includes at least one cut or slit defined therein so that the sheet can break or crack at the cut or slit upon exposure to excessive stress.

20. A solar cell panel comprising a plurality of solar cell modules as set forth in claim 18, the solar cell modules being arranged in a plane on a substrate.

* * * * *